(12) United States Patent
Shen et al.

(10) Patent No.: US 10,891,460 B2
(45) Date of Patent: Jan. 12, 2021

(54) SYSTEMS AND METHODS FOR OPTICAL SENSING WITH ANGLED FILTERS

(71) Applicant: WILL SEMICONDUCTOR (SHANGHAI) CO. LTD., Shanghai (CN)

(72) Inventors: Guozhong Shen, San Jose, CA (US); Richard Klenkler, San Jose, CA (US); Paul Wickboldt, Walnut Creek, CA (US); Young Seen Lee, Newark, CA (US); Patrick Smith, San Jose, CA (US); Bob Lee Mackey, San Jose, CA (US); Marek Mienko, San Jose, CA (US); Arash Akhavan Fomani, Saratoga, CA (US); Alvin Jee, San Jose, CA (US); Erik Jonathon Thompson, San Jose, CA (US); Bjoren Davis, San Jose, CA (US)

(73) Assignee: Will Semiconductor (Shanghai) Co. Ltd., Shanghai (CN)

( * ) Notice: Subject to any disclaimer, the term of this patent is extended or adjusted under 35 U.S.C. 154(b) by 189 days.

(21) Appl. No.: 16/036,615

(22) Filed: Jul. 16, 2018

(65) Prior Publication Data
US 2019/0026523 A1  Jan. 24, 2019

Related U.S. Application Data

(60) Provisional application No. 62/534,186, filed on Jul. 18, 2017.

(51) Int. Cl.
*G06K 9/28* (2006.01)
*G06K 9/00* (2006.01)
(Continued)

(52) U.S. Cl.
CPC .............. *G06K 9/0004* (2013.01); *G02B 6/25* (2013.01); *G02B 6/4203* (2013.01); *G02B 27/30* (2013.01);
(Continued)

(58) Field of Classification Search
CPC ........ G06K 9/0004; G02B 6/25; G02B 27/30; G02B 6/04–6/08; H01L 27/3234
See application file for complete search history.

(56) References Cited

U.S. PATENT DOCUMENTS

| | | | |
|---|---|---|---|
| 2004/0179722 A1* | 9/2004 | Moritoki | G02B 6/06 382/124 |
| 2013/0120760 A1* | 5/2013 | Raguin | G01B 11/24 356/612 |
| 2019/0228204 A1* | 7/2019 | Park | G02B 3/0006 |

OTHER PUBLICATIONS

Li et al. "A Physically-based Human Skin Reflection Model," Proceedings of the 10th WSEAS International Conference on Automation & Information, Prague, Czech Republic, pp. 25-30 (Mar. 2009).

* cited by examiner

*Primary Examiner* — Brian Werner
(74) *Attorney, Agent, or Firm* — Christensen O'Connor Johnson Kindness PLLC

(57) ABSTRACT

Disclosed is a device for optical sensing, comprising: a display comprising a transparent substrate and a plurality of light emitters disposed above the transparent substrate; a transparent cover layer disposed above the display, wherein a top surface of the transparent cover layer provides an input surface for sensing an input object; and, an angled filter disposed below the transparent substrate of the display, wherein the angled filter is configured to allow light within a tolerance angle of an acceptance angle to pass through the angled filter, wherein the acceptance angle is centered
(Continued)

around a non-zero angle relative to a normal of the input surface.

19 Claims, 17 Drawing Sheets

(51) Int. Cl.
*G02B 6/25* (2006.01)
*G02B 6/42* (2006.01)
*G02B 27/30* (2006.01)
*H01L 51/52* (2006.01)
*H01L 27/32* (2006.01)
*H01L 51/00* (2006.01)
*G06K 9/32* (2006.01)

(52) U.S. Cl.
CPC ........... *G06K 9/001* (2013.01); *G06K 9/0008* (2013.01); *G06K 9/00046* (2013.01); *G06K 9/3275* (2013.01); *H01L 27/3234* (2013.01); *H01L 51/0096* (2013.01); *H01L 51/5253* (2013.01); *H01L 51/5281* (2013.01)

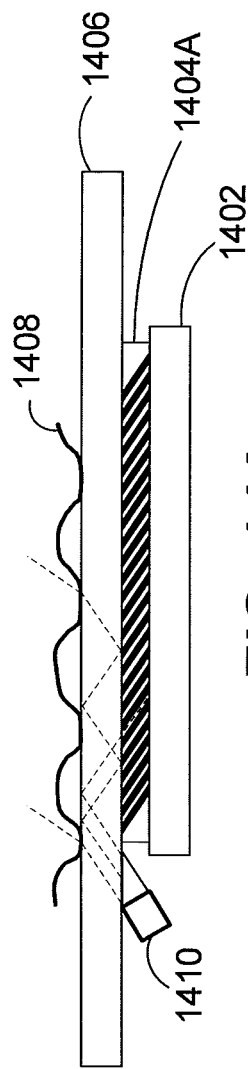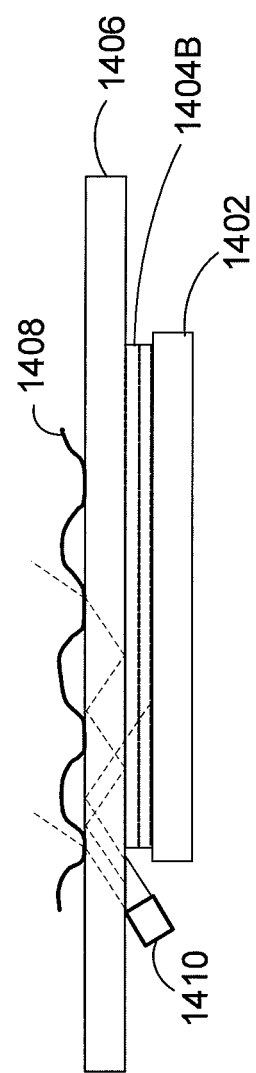

SYSTEMS AND METHODS FOR OPTICAL SENSING WITH ANGLED FILTERS

CROSS-REFERENCE TO RELATED APPLICATIONS

This patent application claims priority of U.S. Provisional Patent Application Ser. No. 62/534,186, filed Jul. 18, 2017, which is hereby incorporated by reference in its entirety.

BACKGROUND

Object imaging is useful in a variety of applications. By way of example, biometric recognition systems image biometric objects for authenticating and/or verifying users of devices incorporating the biometric recognition systems. Biometric imaging provides a reliable, non-intrusive way to verify individual identity for recognition purposes. Various types of sensors may be used for biometric imaging.

SUMMARY

One embodiment provides a device for optical sensing, comprising: a display comprising a transparent substrate and a plurality of light emitters disposed above the transparent substrate; a transparent cover layer disposed above the display, wherein a top surface of the transparent cover layer provides an input surface for sensing an input object; and an angled filter disposed below the transparent substrate of the display, wherein the angled filter is configured to allow light within a tolerance angle of an acceptance angle to pass through the angled filter, wherein the acceptance angle is centered around a non-zero angle relative to a normal of the input surface.

Another embodiment provides an optical sensor, comprising: an image sensor array comprising a plurality of pixels; and an angled filter disposed above the image sensor array, the angled filter comprising a plurality of light collimating apertures and light blocking material, wherein the angled filter is configured to allow light reflected from an input surface towards the image sensor array that is within a tolerance angle of an acceptance angle to pass through the angled filter, wherein the acceptance angle is centered around a non-zero angle relative to a normal of the input surface.

Yet another embodiment provides a method of forming an optical element, the method comprising: providing a bundle of optical fibers in which each of the optical fibers includes a core surrounded by a light absorbing material; slicing the bundle with a plurality of cuts to form an angled filter, wherein each cut of the plurality of cuts is parallel to each other cut and is between 0 and 90 degrees relative to an axis of the optical fibers; and forming an optical sensor that includes the angled filter.

BRIEF DESCRIPTION OF THE DRAWINGS

FIGS. 14A-14B show examples in which an angular filter (such as one of the angled collimators described above) can be used outside of any display area in connection with discrete light source for illuminating the sensing region, according to various embodiments.

DETAILED DESCRIPTION

The following detailed description is exemplary in nature and is not intended to limit the invention or the application and uses of the invention. Furthermore, there is no intention to be bound by any expressed or implied theory presented in the following detailed description.

As described in greater detail herein, disclosed is an optical sensor including an angled collimator structure that allows incident light of a predetermined, non-zero acceptance angle to pass through the collimator structure to reach image sensor elements. In the context of fingerprint sensing, the non-zero angle is optimized relative to a vertical axis (i.e., relative to normal of a sensing surface), such that improved ridge/valley contrast is achieved.

Figure 1:
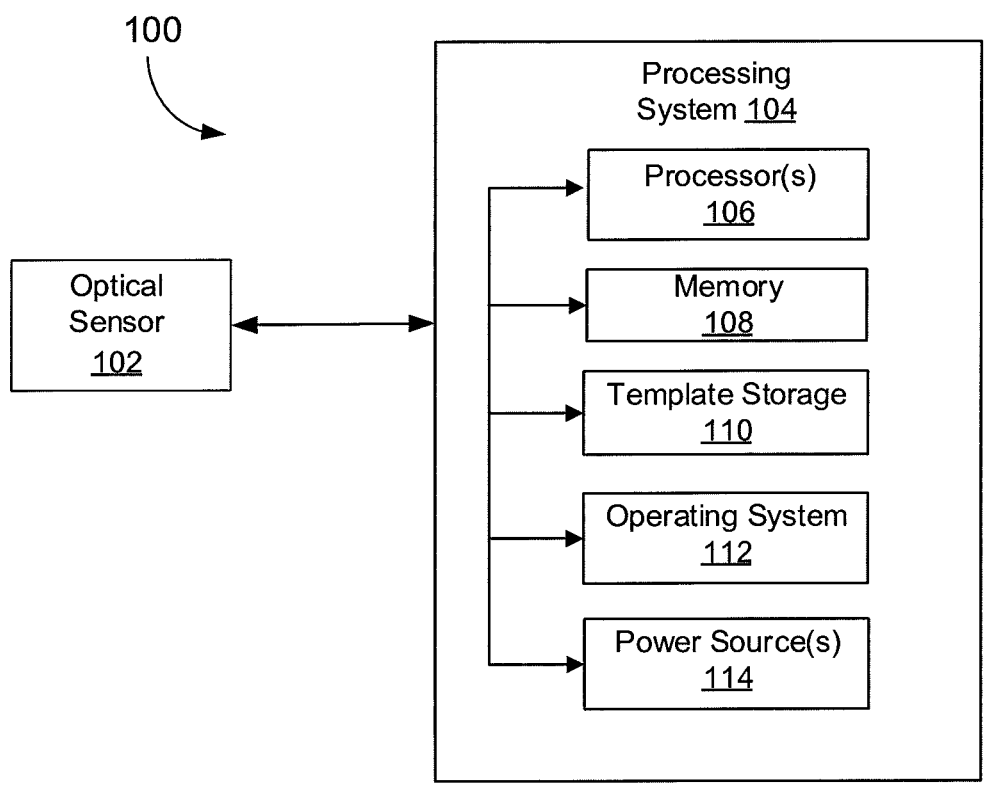
FIG. 1 is a block diagram of an example of an electronic device that includes an optical sensor and a processing system, according to an embodiment of the disclosure.

Turning to the drawings, FIG. 1 is a block diagram of an example of an electronic device 100 that includes an optical sensor 102 and a processing system 104, according to an embodiment of the disclosure.

By way of example, basic functional components of the electronic device 100 utilized during capturing, storing, and validating a biometric match attempt are illustrated. The processing system 104 may include processor(s) 106, memory 108, template storage 110, operating system (OS) 112, and power source(s) 114. Processor(s) 106, memory 108, template storage 110, and operating system 112 may be connected physically, communicatively, and/or operatively to each other directly or indirectly. The power source(s) 114 may be connected to the various components in processing system 104 to provide electrical power as necessary.

As illustrated, the processing system 104 may include processing circuitry including one or more processor(s) 106 configured to implement functionality and/or process instructions for execution within electronic device 100. For example, processor(s) 106 execute instructions stored in memory 108 or instructions stored on template storage 110 to normalize an image, reconstruct a composite image, identify, verify, or otherwise match a biometric object, or determine whether a biometric authentication attempt is successful. Memory 108, which may be a non-transitory, computer-readable storage medium, may be configured to store information within electronic device 100 during operation. In some embodiments, memory 108 includes a temporary memory, an area for information not to be maintained when the electronic device 100 is turned off. Examples of such temporary memory include volatile memories such as random access memories (RAM), dynamic random access memories (DRAM), and static random access memories (SRAM). Memory 108 may also maintain program instructions for execution by the processor(s) 106.

Template storage 110 may comprise one or more non-transitory computer-readable storage media. In the context of a fingerprint sensor device or system, the template storage 110 may be configured to store enrollment views or image data for fingerprint images associated with a user's fingerprint, or other enrollment information, such as template identifiers, enrollment graphs containing transformation information between different images or view, etc. More generally, the template storage 110 may store information about an input object. The template storage 110 may further be configured for long-term storage of information. In some examples, the template storage 110 includes non-volatile storage elements. Non-limiting examples of non-volatile storage elements include magnetic hard discs, solid-state drives (SSD), optical discs, floppy discs, flash memories, or forms of electrically programmable memories (EPROM) or electrically erasable and programmable (EEPROM) memories, among others.

The processing system 104 may also host an operating system (OS) 112. The operating system 112 may control operations of the components of the processing system 104. For example, the operating system 112 facilitates the interaction of the processor(s) 106, memory 108, and template storage 110.

According to some embodiments, the processor(s) 106 implements hardware and/or software to obtain data describing an image of an input object. In some implementations, the processor(s) 106 may also determine whether there is a match between two images, e.g., by aligning two images and compare the aligned images to one another. The processor(s) 106 may also operate to reconstruct a larger image from a series of smaller partial images or sub-images, such as fingerprint images when multiple partial fingerprint images are collected during a biometric process, such as an enrollment or matching process for verification or identification.

The processing system 104 may include one or more power source(s) 114 to provide power to the electronic device 100. For example, the power source(s) 114 may provide power to one or more of the components of the processing system 104 and/or to the optical sensor 102. In some implementations, the power source(s) 114 may be external to the processing system 104 or external to the electronic device 100. Non-limiting examples of power source(s) 114 include single-use power sources, rechargeable power sources, and/or power sources developed from nickel-cadmium, lithium-ion, or other suitable material as well power cords and/or adapters, which are in turn connected to electrical power.

Optical sensor 102 can be implemented as part of the electronic device 100, or can be physically separate from the electronic device 100. As appropriate, the optical sensor 102 may communicate with parts of the electronic device 100 using any one or more of the following: buses, networks, and other wired or wireless interconnection and communication technologies. Examples technologies may include Inter-Integrated Circuit ($I^2C$), Serial Peripheral Interface (SPI), PS/2, Universal Serial bus (USB), Bluetooth®, Infrared Data Association (IrDA), and various radio frequency (RF) communication protocols defined by the IEEE 802.11 standard. In some embodiments, optical sensor 102 is implemented as a fingerprint sensor to capture a fingerprint image of a finger of a user. In accordance with the disclosure, the optical sensor 102 uses optical sensing for the purpose of object imaging including imaging biometrics such as fingerprints. The optical sensor 102 can be incorporated as part of a display, for example, or may be a discrete sensor.

Some non-limiting examples of electronic devices 100 include personal computing devices (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras).

In some embodiments, the optical sensor 102 may provide illumination to the sensing region. Reflections from the sensing region in the illumination wavelength(s) are detected to determine input information corresponding to the input object.

The optical sensor 102 may utilize principles of direct illumination of the input object, which may or may not be in contact with a sensing surface of the sensing region depending on the configuration. One or more light sources and/or light guiding structures may be used to direct light to the sensing region. When an input object is present, this light is reflected from surfaces of the input object, which reflections can be detected by the optical sensing elements and used to determine information about the input object.

The optical sensor 102 may also utilize principles of internal reflection to detect input objects in contact with a sensing surface. One or more light sources may be used to direct light in a light guiding element at an angle at which it is internally reflected at the sensing surface of the sensing region, due to different refractive indices at opposing sides of the boundary defined by the sensing surface. Contact of the sensing surface by the input object causes the refractive index to change across this boundary, which alters the internal reflection characteristics at the sensing surface, causing light reflected from the input object to be weaker at portions where it is in contact with the sensing surface. Higher contrast signals may be achieved using frustrated total internal reflection (FTIR) to detect the input object. In such embodiments, the light may be directed to the sensing surface at an angle of incidence at which it is totally internally reflected, except where the input object is in contact with the sensing surface and causes the light to partially transmit across this interface. An example of this is presence of a finger introduced to an input surface defined by a glass to air interface. The higher refractive index of human skin compared to air causes light incident at the sensing surface at the critical angle of the interface to air to be partially transmitted through the finger, where it would otherwise be totally internally reflected at the glass to air interface. This optical response can be detected by the system and used to determine spatial information. In some embodiments, this can be used to image small scale fingerprint features, where the internal reflectivity of the incident light differs depending on whether a ridge or valley is in contact with that portion of the sensing surface.

Figure 2:
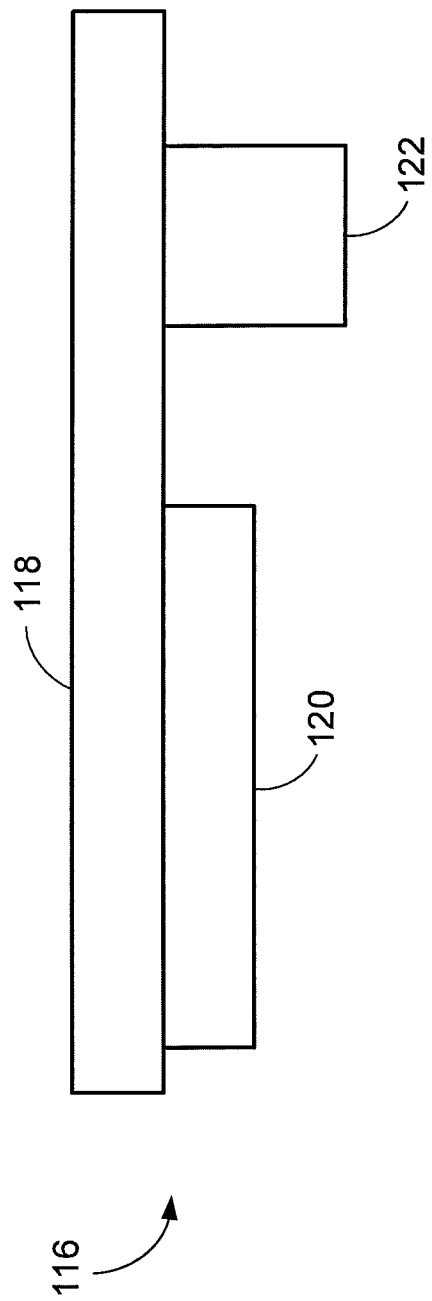
FIG. 2 illustrates an example of an electronic device, which includes a cover layer over a display, according to an embodiment of the disclosure.

FIG. 2 illustrates an example of an electronic device 116, such as a mobile phone, which includes a cover layer, such as cover glass 118, over a display 120. The disclosed method and system may be implemented such that the display 120 includes an optical sensor to image an input object. Alternatively, a separate discrete component 122 may include an optical sensor that provides the optical sensing capabilities. A discrete component 122 may provide more flexibility in designing the optical components of the sensor for optimum illumination and/or signal conditioning than when attempting to integrate the optical sensor components on a display substrate, such as a thin film transistor (TFT) backplane. In one embodiment, the discrete component 122 is not located beneath the display 120, as shown in FIG. 2. In another embodiment, the discrete component 122 is located beneath the display 120.

Figure 3:
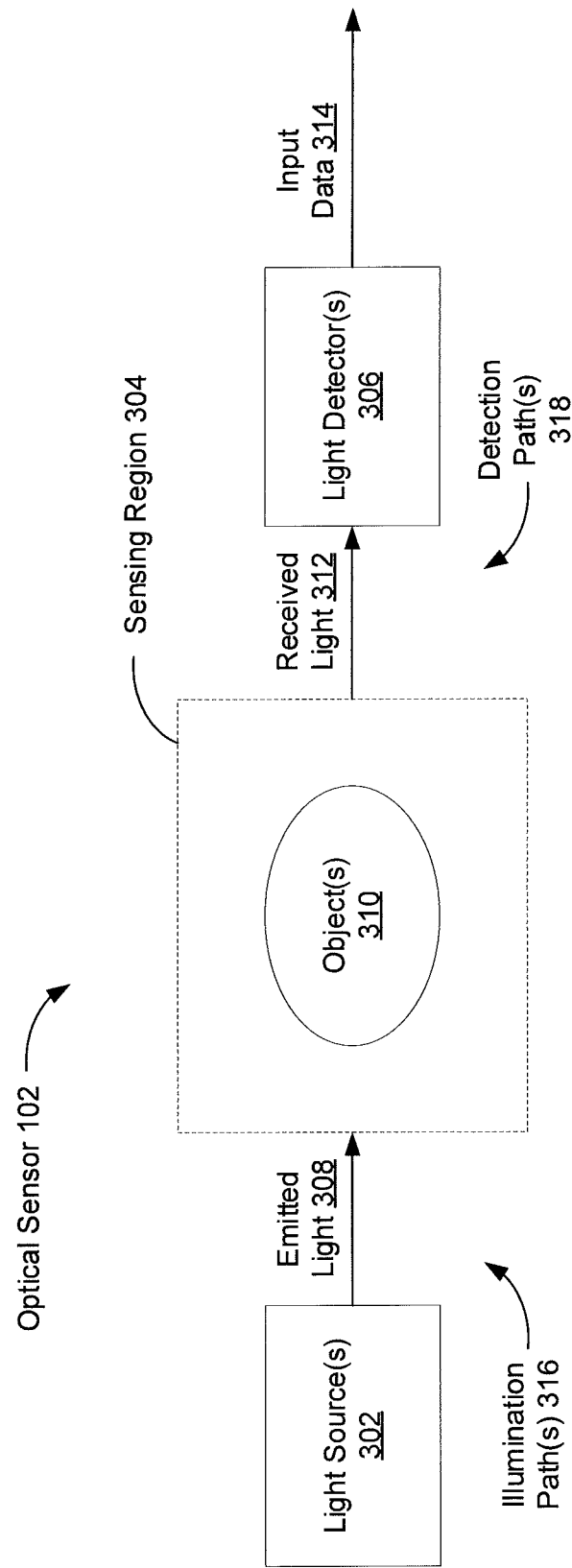
FIG. 3 depicts an optical sensor in accordance with some embodiments of the disclosure.

FIG. 3 depicts an optical sensor 102 in accordance with some embodiments of the disclosure. The optical sensor 102 is generally configured in an optical system that measures a physical characteristic by detecting electromagnetic radiation. The optical sensor 102 includes one or more light source(s) 302 for illuminating a sensing region 304 and one or more light detector(s) 306 for detecting light from the sensing region 304. When operated, the light source(s) 302 provide emitted light 308 to the sensing region 304, and the emitted light 308 interacts with object(s) 310 when the object(s) 310 are in or near the sensing region 304. The light detector(s) 306 detect received light 312 from the sensing region 304 and convert the received light 312 into input data 314.

The sensing region 304 shown in FIG. 3 generally comprises a region from which the optical sensor 102 is configured to sense input information. More specifically, the sensing region 304 comprises one or more spaces or areas in which the object(s) 310 can be positioned (in whole or in part) and detected by the optical sensor 102. The sensing region 304 is coupled optically to the light source(s) 302 to provide one or more illumination paths 316 for the emitted light 308 to reach the sensing region 304 from the light source(s) 302. The sensing region 304 is also coupled optically to the light detector(s) 306 to provide one or more detection path(s) 318 for the received light 312 to reach the light detector(s) 306 from the sensing region 304. The illumination path(s) 316 and the detection path(s) 318 may include physically separate optical paths or optical paths that may intersect or overlap (in whole or in part). Some embodiments of the sensing region 304 include a three-dimensional space encompassing a portion of the environment that is within a suitable depth or range of the light source(s) 302 and the light detector(s) 306 for depth imaging or proximity sensing. Some embodiments of the sensing region 304 include an input surface (e.g., a sensor plate) having an area for receiving contact of the object(s) 310 for contact imaging or touch sensing.

The light source(s) 302 may include one or more light emitting diodes (LEDs), lasers, electroluminescent devices, or other light emitters configured to illuminate the sensing region 304 for object detection. Some embodiments of the light source(s) 302 include electronic components that comprise organic or inorganic materials that may be electronically controlled or operated. In some embodiments, the light source(s) 302 includes a plurality of light sources that may be arranged in a regular array or irregular pattern, and further, the plurality of light sources may be physically located together or spatially segregated in two or more separate locations. The light source(s) 302 may emit one or more wavelengths of light in the visible or invisible spectrum. Some embodiments of the light source(s) 302 emit light in a narrow band, a broad band, or multiple different bands. In some embodiments, the light source(s) 302 includes one or more dedicated light emitters that are used only for illuminating the sensing region 304 for object detection. In some embodiments, the light source(s) 302 includes one more light emitters associated with one or more other functions of an electronic system, such as displaying visual information or images to a user.

The light detector(s) 306 may include one or more photodiodes (PDs), charge coupled devices (CCDs), phototransistors, photoresistors, or other photosensors configured to detect light from the sensing region 304 for object detection. The light detector(s) 306 may include organic or inorganic materials and which may be electronically measured or operated. In some embodiments, the light detector(s) 306 includes a plurality of light detectors, which may be arranged in a regular array or irregular pattern and may be physically located together or spatially segregated in two or more separate locations. In some embodiments, the light detector(s) 306 includes one or more image sensors, which may be formed using a complementary metal-oxide-semiconductor (CMOS) or a thin film transistor (TFT) process. The light detector(s) 306 may detect light in a narrow band, a broad band, or multiple different bands, which may have one or more wavelengths in the visible or invisible spectrum. The light detector(s) 306 may be sensitive to all or a portion of the band(s) of light emitted by the light source(s) 302.

The object(s) 310 includes one or more animate or inanimate objects that provide input information that is of interest to the optical sensor 102. In some embodiments, the object(s) 310 includes one or more persons, fingers, eyes, faces, hands, or styluses. When the object(s) 310 is positioned in the sensing region 304, all or a portion of the emitted light 308 may interact with the object(s) 310, and all or a portion of the emitted light 308 may be reach to the light detector(s) 306 as received light 312. The received light 312 may contain effects corresponding to the interaction of the emitted light 308 with the object(s) 310. In some embodiments, the interaction of the emitted light 308 includes reflection, refraction, absorption, or scattering by the object(s) 310. In some embodiments, the received light 312 includes light reflected, refracted, or scattered by the object(s) 310 or one or more surfaces of the sensing region 304.

The light detector(s) 306 convert all or a portion of the detected light into input data 314 containing information associated with the object(s) 310. The input data 314 may include one or more electronic signals or images containing input information, such as positional information, spectral information, temporal information, spatial information, biometric information, or image information. The optical sensor 102 may provide or transmit the input data 314 to one or more processing components or processing systems (such as, for example, processing system 104 in FIG. 1) for storage or further processing.

Components of the optical sensor 102 may be contained in the same physical assembly or may be physically separate. For example, the light source(s) 302, the light detector(s) 306, or sub-components thereof may be contained in the same semiconductor package or same device housing. Alternatively, the light source(s) 302, the light detector(s) 306, or sub-components thereof may be contained in two or more separate packages or device housings. Also, some components of the optical sensor 102, such as the object(s) 310 and the sensing region 304, may or may not be included as part of a physical assembly of the optical sensor 102. In some embodiments, the object(s) 310 is provided by one or more users or environments during operation of the optical sensor 102. In some embodiments, the sensing region 304 includes a structural input surface or housing included with a physical assembly of the optical sensor 102. In some embodiments, the sensing region 304 includes an environmental space associated with the optical sensor 102 during its operation. Further, in some embodiments one or more additional optical components (not pictured) are included to act on the light in the optical sensor 102. For example, one or more light guides, lenses, mirrors, refractive elements, diffractive elements, spatial filters, spectral filters, polarizers, collimators, or pinholes may be included in the illumination path(s) 316 or detection path(s) 318 to modify or direct the light as appropriate for detection of the object(s) 310. In some embodiments, one or more angled spatial filters or angled collimators (e.g., angled optical fibers, offset aperture stacks, offset microlenses, etc.) may be disposed in the illumination path(s) 316 or detection path(s) 318 to control a direction of the emitted light 308 or the received light 312.

Some under-OLED sensors suffer from poor signal-to-noise ratio (SNR), e.g., ~5:1, which can result in poor fingerprint sensing performance, especially with dry fingers. Some of the disclosed embodiments provide a sensing system with improved SNR.

Figure 4:
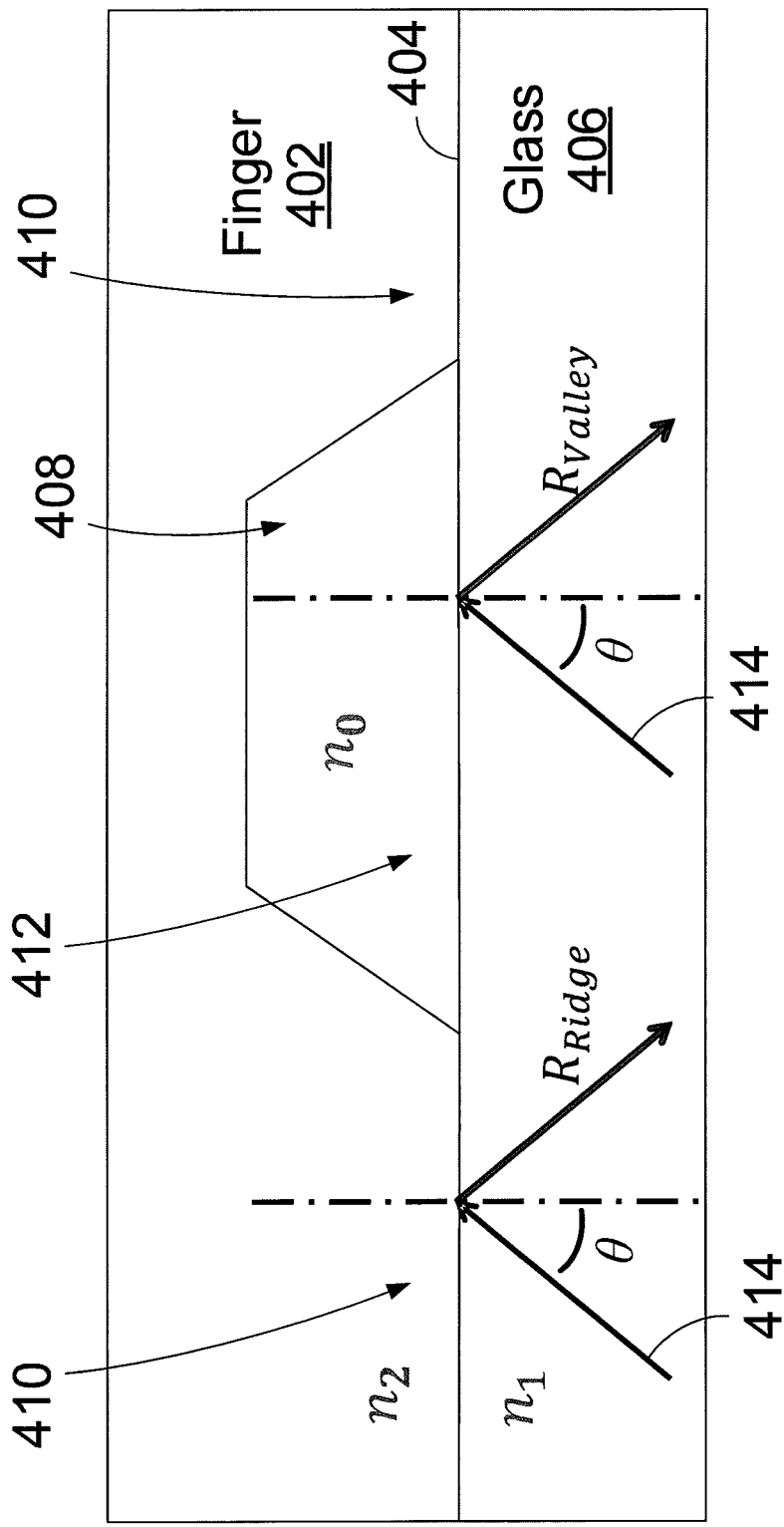
FIG. 4 depicts example reflectance in an optical fingerprint sensor, in accordance with some embodiments.

FIG. 4 depicts example reflectance in an optical fingerprint sensor, in accordance with some embodiments. As shown, a finger 402 is placed on glass 406. Interface 404 provides a sensing surface for the finger 402 to be placed on the glass 406. The finger 402 includes ridges 410 and valley 412.

In the example shown in FIG. 4, the glass 406 has refractive index $n_1$, the finger 402 has refractive index $n_2$, and an air gap 408 formed by the valley 412 has refractive index $n_0$. The refractive index of the skin of finger 402 can vary from person to person and depends on light frequency, but some typical ranges are between approximately 1.37 and 1.50. Referring to FIG. 4, ridge reflectance ($R_{Ridge}$) between glass 406 and ridges 410 and valley reflectance ($R_{Valley}$) between glass 406 and valley 412 are different. The difference (i.e., $R_{Ridge} - R_{Valley}$) is referred to as "ridge/valley contrast," and is what allows the optical fingerprint sensor to differentiate between ridges 410 and valleys 412 of the finger 402. A higher ridge/valley contrast can improve optical fingerprint sensing performance.

The ridge reflectance $R_{Ridge}$ and valley reflectance $R_{Valley}$ we are governed by the Fresnel equations and are dependent on the polarization of the incident light 414.

For s-polarized light, the reflectance ($R_S$) between glass 406 and ridge 410 is governed by the equation:

$$R_S = \left[ \frac{n_{1*}\cos(\theta) - n_{2*}\sqrt{1 - \left(\frac{n_1}{n_2}\sin(\theta)\right)^2}}{n_{1*}\cos(\theta) + n_{2*}\sqrt{1 - \left(\frac{n_1}{n_2}\sin(\theta)\right)^2}} \right]^2 \quad \text{(Eq. 1)}$$

For p-polarized light, the reflectance ($R_P$) between glass 406 and ridge 410 is governed by the equation:

$$R_P = \left[ \frac{n_{1*}\sqrt{1 - \left(\frac{n_1}{n_2}\sin(\theta)\right)^2} - n_{2*}\cos(\theta)}{n_{1*}\sqrt{1 - \left(\frac{n_1}{n_2}\sin(\theta)\right)^2} + n_{2*}\cos(\theta)} \right]^2 \quad \text{(Eq. 2)}$$

In the equations Eq. 1-2 above, theta ($\theta$) refers to the incident angle relative to the normal of the glass-to-ridge interface (e.g., as shown in FIG. 4). As used herein, p-polarized light has an electric field polarized parallel to the plane of incidence, and an electric field of s-polarized light is perpendicular to the plane of incidence.

The reflectance (R) for non-polarized light between glass 406 and ridge 410 is governed by the equation:

$$R = \frac{1}{2}(R_S + R_P) \quad \text{(Eq. 3)}$$

For the reflectance values between glass 406 and valley 412, the refractive index $n_2$ for skin is replaced with the refractive index $n_0$ for air in the equations (Eq. 1-3) above.

Figure 5:
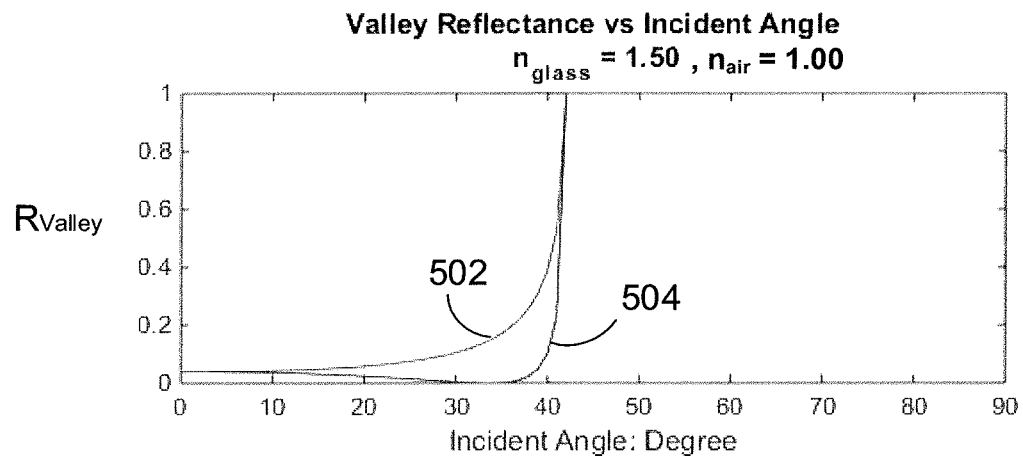
FIG. 5 is a graph illustrating example valley reflectance $R_{Valley}$ plotted against incident angle of incoming light, according to one embodiment.

FIG. 5 is a graph illustrating example valley reflectance $R_{Valley}$ plotted against incident angle ($\theta$) of incoming light, according to one embodiment. In the example shown in FIG. 5, the refractive index of glass ($n_{glass}$) is 1.50, and the refractive index of the air gap of the valley is 1.0. The refractive index of glass ($n_{glass}$) of 1.50 is used throughout the disclosure as an example, although other transparent materials with different refractive indices are also within the score of the disclosure. Curve 502 represents valley reflectance $R_{Valley}$ for s-polarized light. Curve 504 represents valley reflectance $R_{Valley}$ for p-polarized light. As shown, the valley reflectance $R_{Valley}$ increases dramatically just before reaching full reflection (i.e., total internal reflection) at an angle around 40 degrees for both s-polarized light and p-polarized light.

Figure 6:
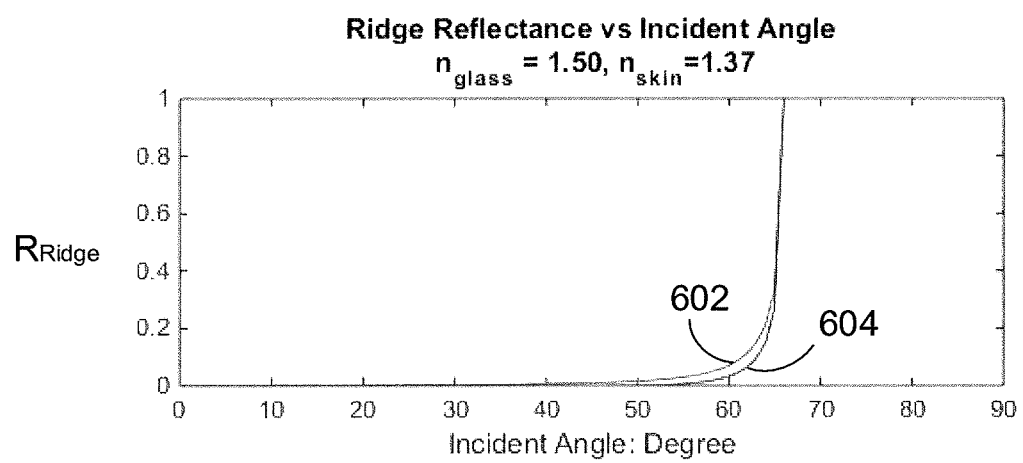
FIG. 6 is a graph illustrating example ridge reflectance $R_{Ridge}$ plotted against incident angle of incoming light, according to one embodiment.

FIG. 6 is a graph illustrating example ridge reflectance $R_{Ridge}$ plotted against incident angle ($\theta$) of incoming light, according to one embodiment. In the example in FIG. 6, the refractive index of glass ($n_{glass}$) is 1.50, and the refractive index of finger skin ($n_{skin}$) of the ridge is 1.37. As indicated above, the refractive index of finger skin can vary from person to person and depend on light frequency, but some typical ranges are between approximately 1.37 and 1.50. Curve 602 represents ridge reflectance $R_{Ridge}$ for s-polarized light. Curve 604 represents ridge reflectance $R_{Ridge}$ for p-polarized light. As shown, the ridge reflectance $R_{Ridge}$ increases dramatically just before reaching full reflection (i.e., total internal reflection) at an angle around 65 degrees for both s-polarized light and p-polarized light.

As can be seen by comparing the plots in FIG. 5 and FIG. 6, full reflection begins at different incident angles for valleys (i.e., approximately 40 degrees) and ridges (i.e., approximately 65 degrees). By subtracting the plots in FIG. 6 from the plots in FIG. 5, a ridge/valley contrast can be determined.

Figure 7:
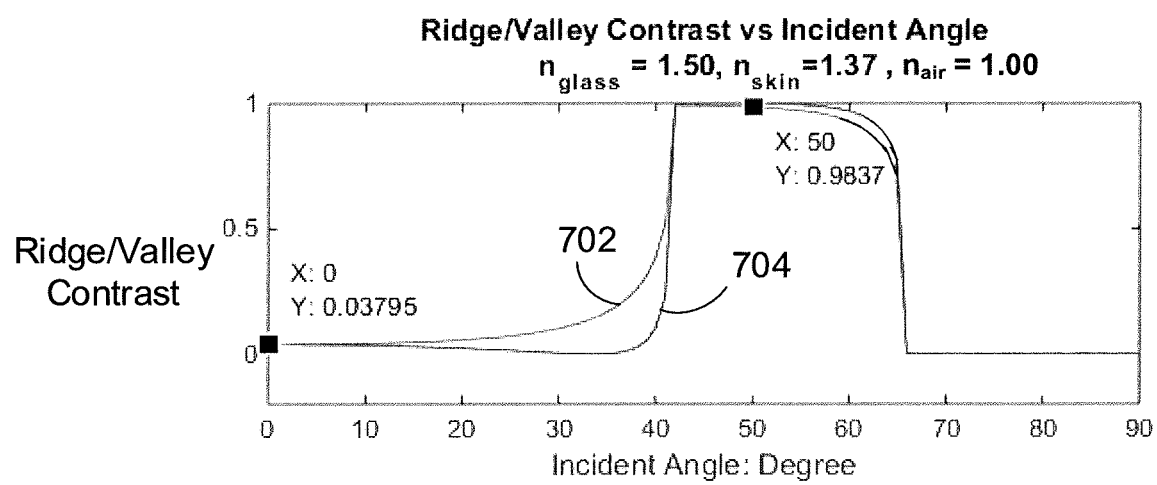
FIGS. 7-8 are graphs illustrating example ridge/valley contrast, according to some embodiments.

FIG. 7 is a graph illustrating example ridge/valley contrast, according to one embodiment. In the example in FIG. 7, the refractive index of glass ($n_{glass}$) is 1.50; the refractive index of finger skin ($n_{skin}$) is 1.37; and the refractive index of air ($n_{air}$) is 1.00. Curve 702 represents ridge/valley contrast for s-polarized light. Curve 704 represents ridge ridge/valley contrast for p-polarized light. As shown in the graph, at an incident angle of 0 degrees (i.e., vertical light, parallel to the normal of the input surface), the ridge/valley contrast is just 3.795%. By contrast, at an incident angle of 50 degrees, the ridge/valley contrast is 98.37%. As such, the signal that differentiates between ridge and valley can be improved by about 20 times (20×) with an optimized incident angle. In the example shown in FIG. 7, an optimized incident angle is approximately 42 degrees to approximately 65 degrees.

Figure 8:
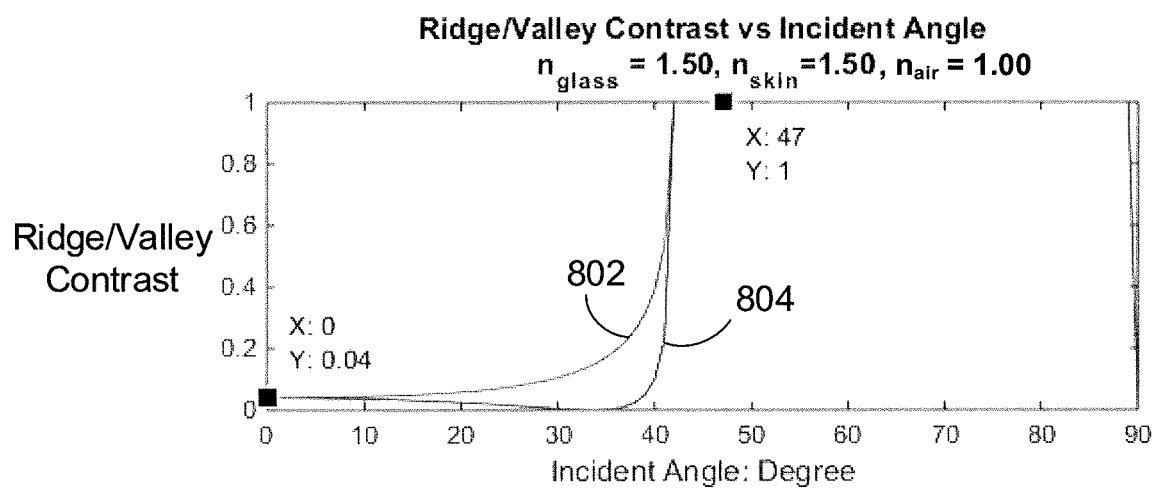

FIG. 8 is another graph illustrating example ridge/valley contrast, according to one embodiment. In the example in FIG. 8, refractive index of glass ($n_{glass}$) is 1.50; refractive index of finger skin ($n_{skin}$) is 1.50; and refractive index of air ($n_{air}$) is 1.00. Curve 802 represents ridge/valley contrast for s-polarized light. Curve 804 represents ridge ridge/valley contrast for p-polarized light. As shown in the graph, at an incident angle of 0 degrees, the ridge/valley contrast is just 4%. By contrast, at an incident angle of 47 degrees, the ridge/valley contrast is 100%. In the example shown in FIG. 8, an optimized incident angle to improve ridge/valley contrast is approximately 42 degrees to approximately 88 degrees.

Figure 9A:
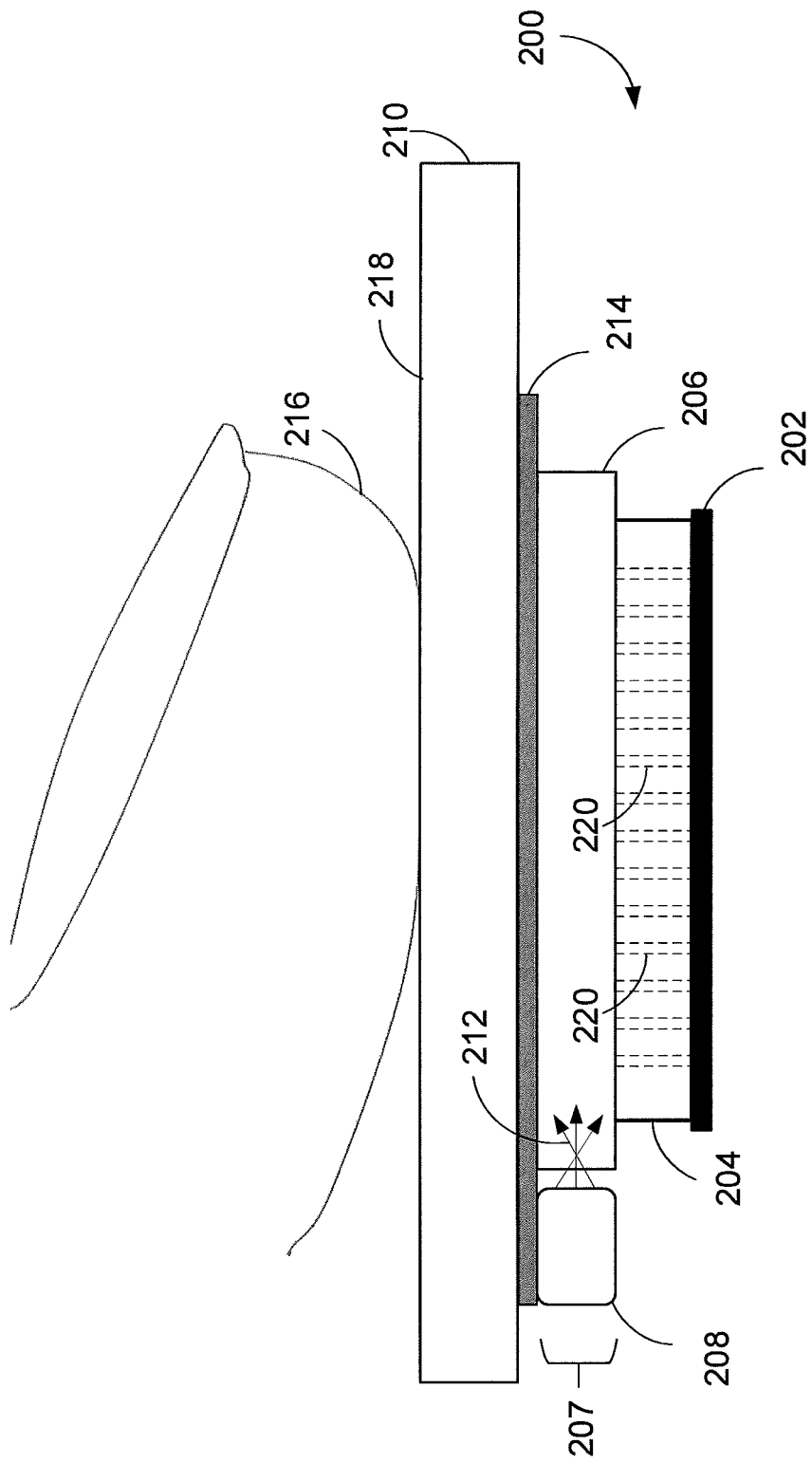
FIGS. 9A-9B illustrate examples of an optical sensor with a collimator filter layer according to an embodiment of the disclosure.

FIG. 9A illustrates an example of a stack-up for an optical sensor device 200 used to image an input object 216, such as a fingerprint. The optical sensor device 200 includes an image sensor array 202, a collimator filter layer (or light conditioning layer) 204 disposed above the image sensor array 202, an illumination layer 207 disposed above the collimator filter layer 204, a light source 208, and a cover layer 210. In certain embodiments, a blocking layer 214 may also be provided.

The cover layer 210 protects the inner components of the optical sensor device 200, such as the image sensor array 202. The cover layer 210 may include a cover glass or cover lens that protects inner components of a display in addition to the optical sensor device 200. A sensing region for the input object is defined above the cover layer 210. A sensing surface 218 (i.e., top surface) of the cover layer 210 provides a contact area for the input object 216 (e.g., fingerprint). The cover layer 210 may be made of any transparent material such as glass, transparent polymeric materials and the like.

Although generally described in the context of a fingerprint for illustrative purposes, the input object 216 can be any object to be imaged. Generally, the input object 216 will have various features. By way of example, when the input object 216 is a fingerprint, it has ridges and valleys. Due to their protruding nature, the ridges contact the sensing surface 218 of the cover layer 210. In contrast, the valleys do not contact the sensing surface 218 and instead form an air gap between the input object 216 and the sensing surface 218. The input object 216 may have other features such as a stain, ink, moisture and the like that do not create significant structural differences in portions of the input object 216, but which may affect its optical properties. The methods and systems disclosed herein are suitable for imaging such structural and non-structural features of the input object 216.

The illumination layer 207 includes a light source 208 and/or a light guiding element 206 that directs illumination to the sensing region in order to image the input object. As shown in FIG. 9A, the light source 208 transmits beams or rays of light 212 into the light guiding element 206 and the transmitted light propagates through the light guiding element 206. The light guiding element 206 may utilize total internal reflection, or may include reflecting surfaces that extract light up towards the sensing region. Some of the light in the illumination layer may become incident at the sensing surface 218 in an area that is contact with the input object 216. The incident light is in turn reflected back towards the collimator filter layer 204. In the example shown, the light source 208 is disposed adjacent to the light guiding element 206. However, it will be understood that the light source 208 may be positioned anywhere within the optical sensor device 200 provided that emitted light reaches the light guiding element 206. For example, the light source 208 may be disposed below the image sensor array 202. Moreover, it will be understood that a separate light guiding element 206 is not required. For example, the light transmitted from the light source 208 can be transmitted directly into the cover layer 210 in which case the cover layer 210 also serves as a light guiding element. As another example, the light transmitted from the light source 208 can be transmitted directly to the sensing region, in which case the light source 208 itself serves as the illumination layer.

The light provided by the illumination layer 207 to image the input object 216 may be in the near infrared (NIR) or visible spectrum. The light can have a narrow band of wavelengths, a broad band of wavelengths, or operate in several bands.

The image sensor array 202 detects light passing through the collimator filter layer 204. Examples of suitable image sensor arrays 202 are complementary metal oxide semiconductor (CMOS) and charge coupled device (CCD) sensor arrays. The image sensor array 202 includes a plurality of individual optical sensing elements capable of detecting the intensity of incident light. In some embodiments, the image sensor array 202 is formed in a silicon sensor substrate. In other embodiments, the image sensor array 202 is formed on a glass thin film transistor substrate.

To achieve optical sensing of fingerprints and fingerprint-sized features through thicker cover layers 210, light reflected from the input object 216 may be conditioned by the collimator filter layer 204 so that the light reaching a sensing element in the image sensor array 202 comes from a small spot on the input object 216 directly or nearly directly above the sensor element. The conditioning can decrease image blurring contributed by unwanted light, e.g., those arriving at a sensing element from an object far away from the optical sensing elements.

In one embodiment, the collimator filter layer 204 is provided with an array of apertures, or collimator holes, 220. Each aperture or hole may be directly above one or more optical sensing elements on the image sensor array 202. In some embodiments, a plurality of apertures (cluster of apertures) may be above a single optical sensing element (also called an imaging cell) with the single optical sensing element comprising, for example, a single photosensor or multiple photosensors combined into a single pixel. The apertures 220 may be formed using any suitable technique, such as laser drilling, etching, and the like. The collimator apertures or holes 220 may form an array of any suitable regular or irregular pattern.

In FIG. 9A, the collimator filter layer 204 allows light rays reflected from the input object 216 (e.g., finger) at normal or near normal incidence to the collimator filter layer 204 to pass and reach the optical sensing elements of the image sensor array 202. In one embodiment, the collimator filter layer 204 is an opaque layer with array of holes 220. The collimator filter layer 204 may be laminated, stacked, or built directly above the image sensor array 202. By way of example, the collimator filter layer 204 may be made of a plastic material such as polycarbonate, PET, polyimide, carbon black, inorganic insulating or metallic materials, silicon, or SU-8. In certain embodiments, the collimator filter layer 204 is monolithic.

An optional blocking layer 214 may be a part of optical sensor device 200. The blocking layer 214 may be a semi-transparent or opaque layer and may be disposed above the collimator filter layer 204. For example, the blocking layer 204 may be disposed between the cover layer 210 and the illumination layer 207, as shown in FIG. 9A. Alternatively, the blocking layer 214 may be disposed between the illumination layer 207 and the collimator filter layer 204. The blocking layer 214 may be configured to obscure ambient light illumination from reaching the image sensor array 202, while still allowing the optical sensor device 200 to operate. The blocking layer 214 may include a number of different materials or sub-layers. For example, a thin metal or electron conducting layer may be used where the layer thickness is less than the skin depth of light penetration in the visible spectrum. Alternatively, the blocking layer 214 may include a dye and/or pigment or several dyes and/or pigments that absorb light, for example, in the visible spectrum. As yet another alternative, the blocking layer 214 may include several sub-layers or nano-sized features configured to cause interference with certain wavelengths, such as visible light for example, so as to selectively absorb or reflect different wavelengths of light. The light absorption profile of the blocking layer 214 may be formulated to give a particular appearance of color, texture, or reflective quality thereby allowing for particular aesthetic matching or contrasting with the device into which the optical sensor device 200 is integrated. In some embodiments, a semitransparent material may be used with visible illumination wavelengths to allow sufficient light to pass through the blocking layer 214 to the sensing region while still sufficiently obscuring components below.

Figure 9B:
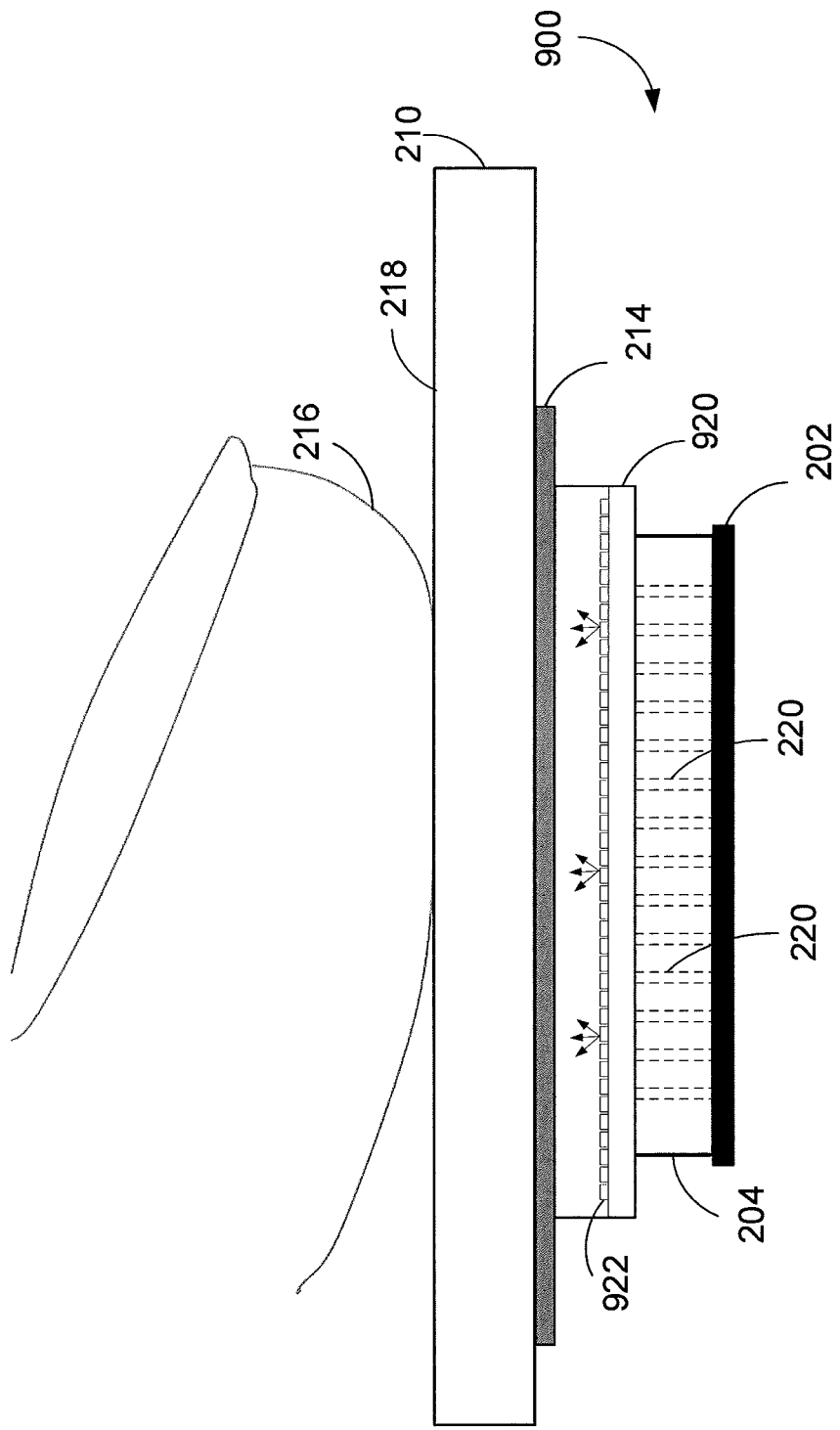

FIG. 9B illustrates another example of a stack-up for an optical sensor device 900. The optical sensor device 900 includes an image sensor array 202, a collimator filter layer (or light conditioning layer) 204 disposed above the image sensor array 202, a display layer 920 disposed above the collimator filter layer 204, and a cover layer 210. In some embodiments, an optional blocking layer 214 may also be provided. As shown in FIG. 9B, light from the display layer 920 may be used to illuminate the input object 216 (e.g., finger). In this embodiment, a discrete light source is not required.

The display layer 920 may comprise the display screen of an electronic device and may include a plurality of light sources 922. The display layer 920 may be any type of dynamic display capable of displaying a visual interface to a user, and may include any type of light sources 922, such as light emitting diodes (LEDs), organic LEDs (OLEDs), cathode ray tube (CRT), liquid crystal display (LCD), plasma, electroluminescence (EL), or other display technology. The display layer 920 may also be flexible or rigid, and may be flat, curved, or have other geometries. In some embodiments, the display layer 920 includes a glass or plastic substrate for TFT circuitry and/or other circuitry, which may be used to provide images and/or provide other functionality. The cover layer 210 is disposed above display layer 920 and may provide a sensing surface 218 for the input object 216. Example cover layer 210 materials include plastic, optically clear amorphous solids, such as chemically hardened glass, as well as optically clear crystalline structures, such as sapphire. In some embodiments, the display layer 920 may comprise a polarizer, e.g., a p-polarizer or an s-polarizer. When referring to polarization states, p-polarization refers to the polarization plane parallel to the polarization axis of the polarizer being used. The s-polarization refers to the polarization plane perpendicular to the polarization axis of the polarizer.

When sensing input objects, e.g., sensing fingerprints or fingerprint-sized features through thicker cover layers 210, light emitted by the light sources 922 of the display layer 920 reflected from the input object 216 may be conditioned by the collimator filter layer 204 so that the light reaching a sensing element in the image sensor array 202 comes from a portion of the input object 216 directly above the sensor element.

In FIGS. 9A-9B, collimator filter layer 204 includes vertically oriented apertures, or collimator holes, 220. As such, the collimator filter layer 204 allows vertical or nearly vertical light (i.e., light within a tolerance angle from a vertical axis) to arrive at the image sensor array 202. In this example, the vertical axis corresponds to a normal of the sensing surface 218 and/or a normal of a plane of light sources 922.

Figure 10:
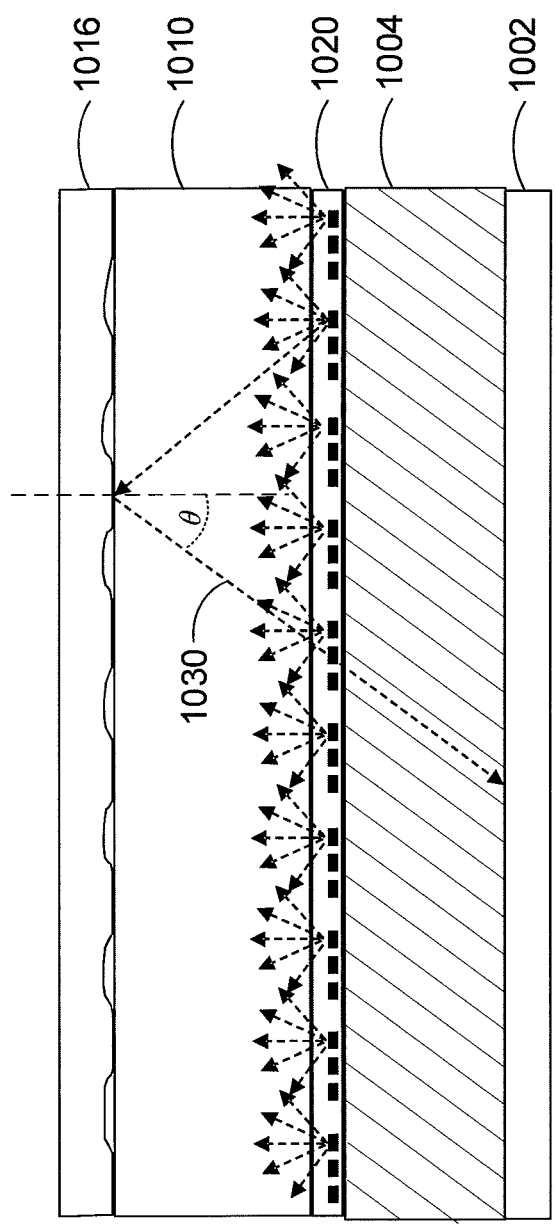
FIG. 10 depicts an example of an optical fingerprint sensor stack-up having an angled collimator, according to one embodiment.

FIG. 10 depicts yet another example of an optical fingerprint sensor stack-up. In this example, an image sensor array 1002 is disposed below a display layer 1020 (e.g., below a transparent OLED display substrate and below light emitters of the OLED display). The display layer 1020 is disposed below a transparent cover layer 1010, where a top surface of the cover layer 1010 provides an input surface for a finger 1016. Light source(s) for illuminating the input surface are disposed in the display layer 1020 (e.g., light emitters disposed above a transparent display substrate, or OLED light emitting display pixels themselves) are used to illuminate the finger 1016. An angled collimator layer 1004 is disposed below the light source(s) and the display layer 1020. The image sensor array 1002 is disposed below the angled collimator layer 1004.

The angled collimator layer 1004 includes apertures or collimator holes oriented at a non-zero angle (θ) relative to vertical, i.e., a normal of the input surface and/or a normal of the pixel plane. In the example shown, light from the display layer 1020 (e.g., light from an OLED sub-pixel emitters) is used as light source, and the emitted light may go in multiple directions. Please note that any wavelengths of light may be used.

The angled collimator layer 1004 allows light 1030 that is parallel to angle θ (or within a tolerance angle of angle θ) to pass through the angled collimator layer 1004 and reach the image sensor layer 1002, while absorbing or blocking other light. By absorbing or blocking unwanted light, angled collimator may reduce SNR and thereby increase ridge/valley contrast, as described herein. In some embodiments, the display layer 1020 may include a polarizer (not shown for simplicity), to further improve ridge/valley contrast.

Figure 11A:
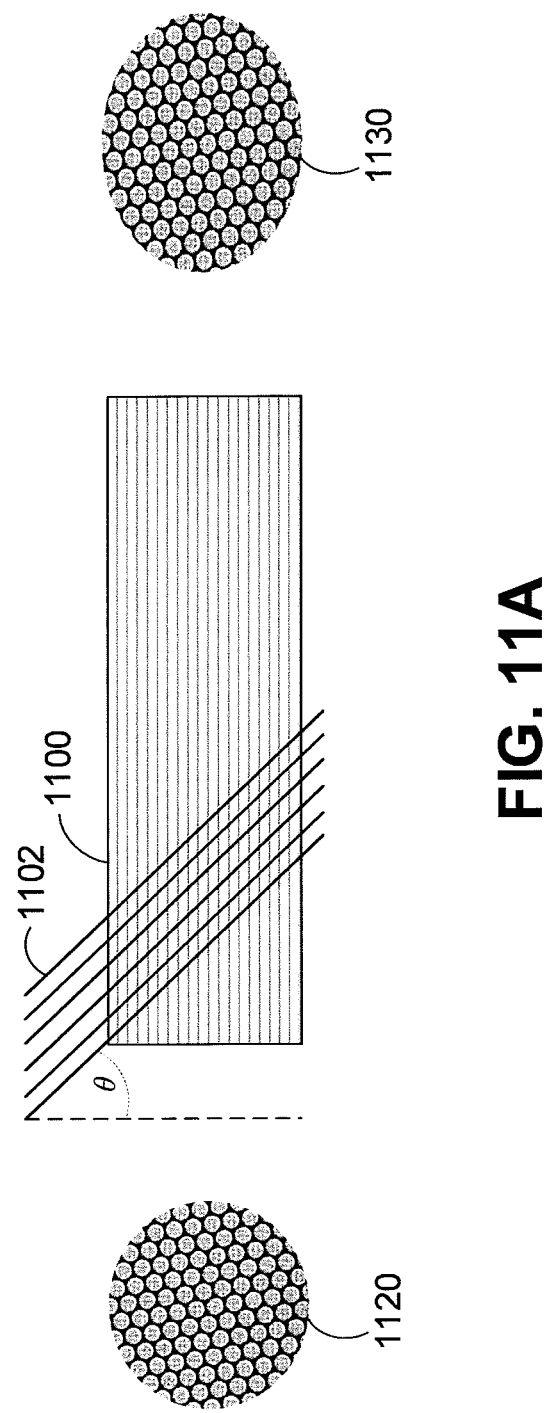
FIG. 11A depicts an example structure and method of manufacturing an angled collimator using a fiber, in accordance with some embodiments.

FIG. 11A depicts an example structure and method of manufacturing an angled collimator using a fiber. The fiber may comprise a fiber bundle 1100 of optical fibers. In some implementations, optical fibers include a core and a cladding surrounding the core arranged to spatially confine light through the core using total internal reflection (e.g., the refractive index of the cladding is less than the refractive index of the core). In some embodiments, a light absorbing material having a refractive index similar to that of the core may be used as the cladding (e.g., black or dark colored glass). In these embodiments, light sufficiently off-axis relative to an axis of the fiber core (i.e., left to right in FIG. 11A) may be absorbed by the light absorbing material rather than totally internally reflected, while light parallel to the axis of the fibers may pass through.

To create an angled collimator similar to that shown in FIG. 10, the fiber bundle 1100 is sliced off-axis (as opposed to cutting or slicing the fiber bundle 1100 perpendicular to the fiber axis which would result in a cross-section of the fiber bundle 1100 shown in image 1120). In particular, the fiber bundle 1100 shown in FIG. 11A may be sliced along cut lines 1102 into multiple angled collimator plates in which each of the plates is sliced at an angle of 90°+θ relative to an axis of the fibers (or θ relative to perpendicular from the axis of the fibers). In some embodiments, a manufacturing tolerance can be considered when selecting the cutting axis θ. For example, if an acceptance angle is desired that is centered around a minimum of 41.8 degrees and maximum of 55 degrees (i.e., referring to earlier calculations in FIGS. 7-8, based on capture of light totally internally reflected by fingerprint valleys, but not ridges), then a nominal cutting axis value of 48 degrees can provide good performance within certain margins. It should also be understood that if the core glass of the fiber bundle 1100 has a refractive index different from 1.5, than the optimized angle can be different. A result of cutting the fiber bundle 1100 along the cutting axis θ is shown as image 1130.

Figure 11B:
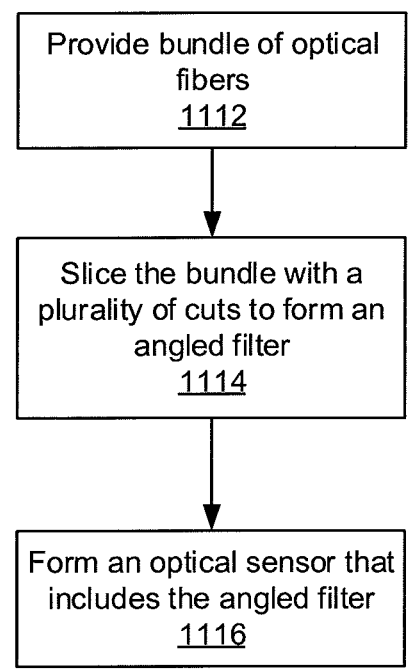
FIG. 11B depicts a flow diagram of forming an optical element, according to one embodiment.

FIG. 11B depicts a flow diagram of forming an optical element, according to one embodiment. At step 1112, a bundle of optical fibers is provided. An example is shown in FIG. 11A. In one embodiment, each of the fibers in the bundle of optical fibers includes a core surrounded by a light absorbing material. At step 1114, the bundle is sliced with a plurality of cuts to form an angled filter. In one embodiment, each cut of the plurality of cuts is parallel to each other cut and is between 0 and 90 degrees relative to an axis of the fibers. At step 1116, an optical sensor is formed that includes the angled filter. As described herein, the angled filter may be disposed above an image sensor array. The angled filter may be configured to allow light reflected from an input surface to pass through the angled filter, where the light is within a tolerance angle of an acceptance angle.

Figure 12:
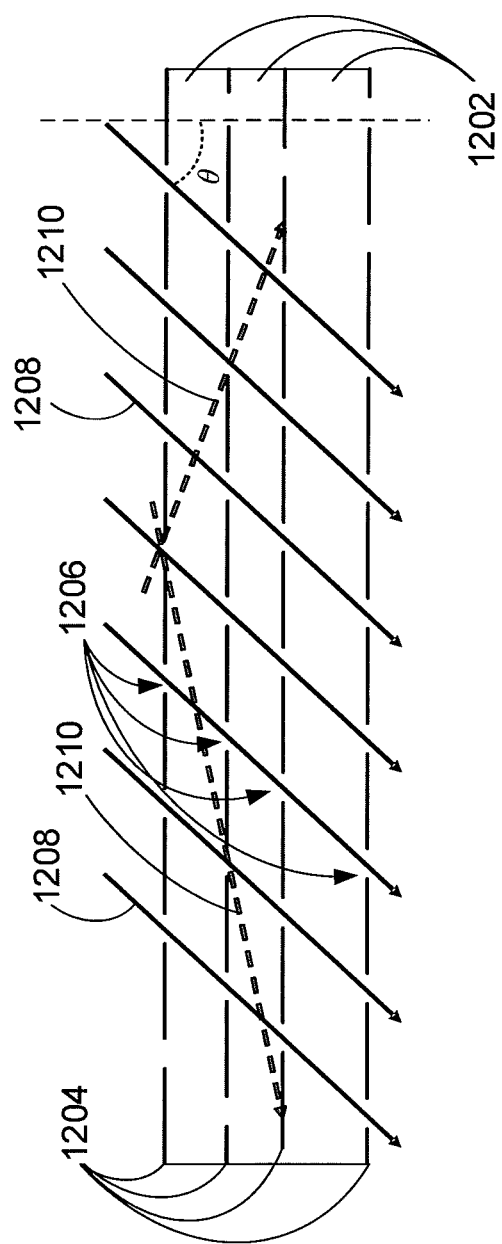
FIG. 12 depicts an example structure and method of manufacturing an angled collimator using stacked aperture layers, in accordance with some embodiments.

FIG. 12 depicts an example structure and method of manufacturing an angled collimator using stacked aperture layers. The angled collimator shown in FIG. 12 includes alternating transparent layers 1202 and multiple patterned light shielding layers 1204 (shown as black lines). Each of the light shielding layers 1204 includes apertures 1206 formed in the patterned light shielding layers 1204. Apertures 1206 allow the light 1208 at acceptance angle (θ) to pass through, while other light 1210 is blocked. The alignment of apertures 1206 in the different layers can determine the acceptance angle (θ) of the light. Instead of having apertures 1206 that are vertically aligned with each other (which would result in a vertically oriented collimator having an acceptance angle centered around a vertical angle), the apertures 1206 are offset relative to each other. For example, the apertures in the bottom light shielding layer are offset from the apertures in the light shielding layer immediately above the bottom light shielding layer, and so forth. This results in an acceptance angle that includes or is centered around a non-zero angle θ, similar to that shown in FIG. 10.

Figure 13:
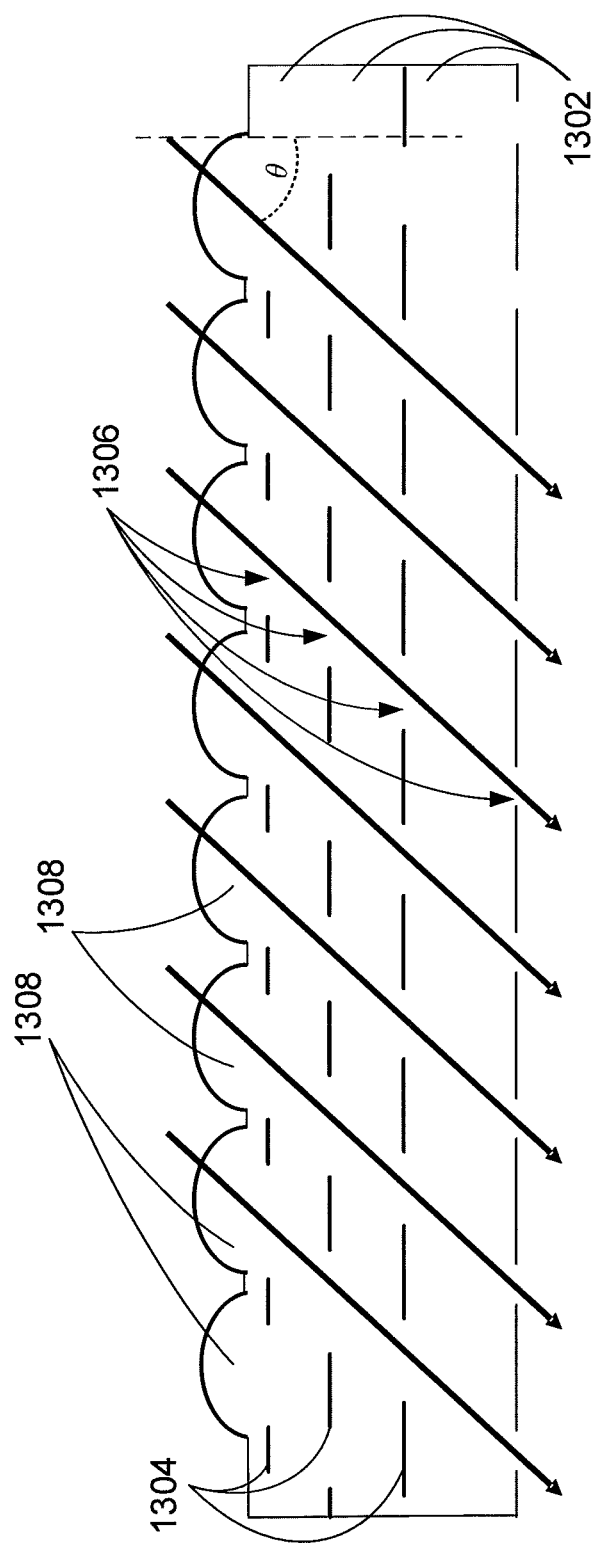
FIG. 13 depicts an example structure and method of manufacturing an angled collimator using stacked aperture layers and microlenses, in accordance with some embodiments

FIG. 13 depicts an example structure and method of manufacturing an angled collimator using stacked aperture layers and microlenses. Similar to the design shown in FIG. 12, the design shown in FIG. 13 includes alternating transparent layers 1302 and patterned light shielding layers 1304 (shown as black lines). Each of the patterned light shielding layers 1304 includes apertures 1306 to allow light to pass through. The apertures 1306 in the patterned light shielding layers 1304 may be arranged to determine the acceptance angle (θ) of the light.

Microlenses 1308 (e.g., a micro lens array) may be included on a top-most transparent layer 1302 to focus light incident on the microlenses 1308 in a certain direction, i.e., in a direction that allows the light to pass through the apertures 1306 of the angled collimator. For example, the microlenses 1308 may focus light from various angles that would otherwise not pass through the apertures 1306, to allow the light to pass through the apertures 1306.

The transparent layers 1302 may have varying thicknesses. For example, the transparent layers 1302 may become thicker towards the bottom of the stack of transparent layers 1302 (i.e., closer to an image sensor array, which would be disposed below the angled collimator), such that the thickest transparent layer 1302 is at the bottom of the stack of layers. In other embodiments, each transparent layer 1302 has the same thickness.

In some embodiments, the patterned light shielding layers 1304 may have varying structure such that the apertures 1306 may be of different sizes (e.g., diameters for circular apertures) for different layers in the stack of layers. Apertures of varying sizes may improve the transmission of light through the collimator. For example, the apertures 1306 may become smaller towards the bottom of the stack of layers (i.e., closer to the image sensor array), such that the smallest apertures 1306 are found at the bottom-most layer of the stack of layers. In other embodiments, the apertures 1306 at each layer may have the same size.

In some implementations, the microlenses 1308 above the collimator may cause the light output from the microlenses 1308 to take the shape of a cone. In such embodiments, by sizing the apertures 1306 differently for different layers in the stack of layers such that the smallest apertures 1306 are found at the bottom-most layer, more light may pass through the collimator as compared with sizing the apertures the same for each layer in the stack of layers.

FIGS. 10-13 have generally been described with reference to angled collimators that are disposed underneath a display layer (e.g., OLED display) and between the display layer and an image sensor array, where the angled collimators control an angle from which the image sensor array accepts light. In some alternate embodiments, a similar image sensor array can be used outside of a display area. In still further embodiments, the angle of illumination can be controlled.

FIGS. 14A-14B show examples in which an angular filter (such as one of the angled collimators described above) can be used outside of a display area in connection with a discrete light source for illuminating the sensing region, according to various embodiments.

In FIG. 14A, a cover layer 1406 is disposed on top of a collimator layer 1404A, which is disposed on top of an image sensor array 1402. The image sensor array 1402 may be disposed within a display area (not shown) of the device. Light from a light source 1410 that is placed outside the display area is directed towards a sensing surface (e.g., top of the cover layer 1406). A finger 1408 can be placed on the sensing surface and detected by sensor components of the image sensor array 1402. As shown in FIG. 14A, the collimator layer 1404A comprises an angled collimator formed using a single layer (e.g., see collimator formed using a fiber bundle in FIG. 11A). The collimator layer 1404A allows incident light at a certain angle (within a tolerance) to pass through the collimator layer 1404A, and incident light of other angles is blocked.

In FIG. 14B, a cover layer 1406 is disposed on top of a collimator layer 1404B, which is disposed on top of an image sensor array 1402. The image sensor array 1402 may be disposed within a display area (not shown) of the device. Light from a light source 1410 that is placed outside the display area is directed towards a sensing surface (e.g., top of the cover layer 1406). A finger 1408 can be placed on the sensing surface and detected by sensor components of the image sensor array 1402. As shown in FIG. 14B, the collimator layer 1404B comprises an angled collimator formed using multiple layers (e.g., see collimators formed using stacked layers in FIGS. 12-13). The collimator layer 1404B allows incident light at a certain angle (within a tolerance) to pass through the collimator layer 1404B, and incident light of other angles is blocked.

Figure 15:
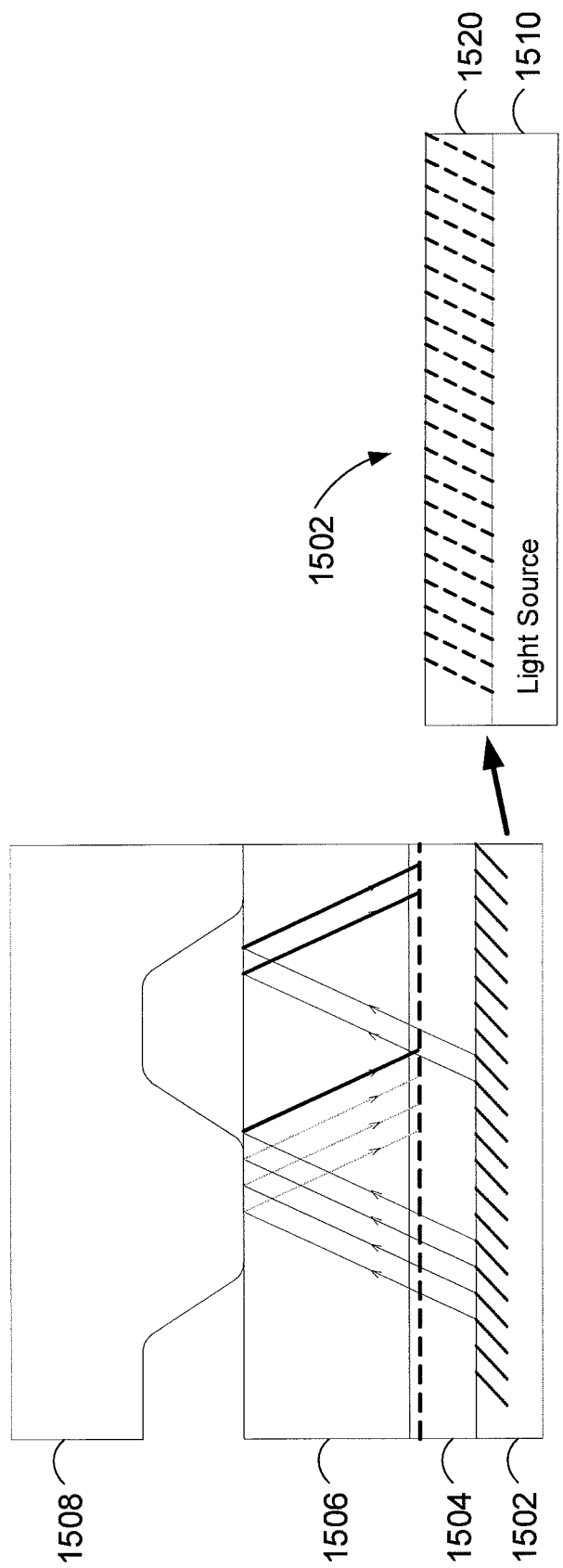
FIG. 15 shows an example in which an angular filter can be used to generate a collimated backlight for illuminating a sensing region, according to one embodiment.

FIG. 15 shows an example in which an angular filter (such as one of the angled collimators described above) can be used to generate a collimated backlight for illuminating a sensing region, according to one embodiment. As shown, a cover layer 1506 is disposed on top of a sensor/display layer 1504, which is disposed on top of a collimated backlight layer 1502. The collimated backlight layer 1502 includes a collimating filter 1520 stacked on top of a light source 1510. A finger 1508 can be placed on an input surface (i.e., top of the cover layer 1506) and detected by sensor components of the sensor/display layer 1504.

In FIG. 15, instead of using an angled collimator in the detection optical path (e.g., between the input surface for the finger 1508 and the image sensor), the angled collimator is disposed in the illumination optical path (e.g., between the light source 1510 and the input surface for the finger 1508). Compared to the example shown in FIG. 10, the positioning of the light source 1510 for illuminating the finger 1508 input surface and the positioning of the image sensor for capturing the light returning from the finger 1508 input surface are inverted in the stackup. Thus, the photosensors for capturing the fingerprint are disposed in the display (e.g., TFT photodiodes or phototransistors formed in an OLED display backplane), the angular filter is disposed below the display (e.g., below a transparent substrate of an OLED display), and a light source 1510 is provided below the collimating filter 1520. In this example, the collimated backlight layer 1502 may further include a brightness enhancement film at the desired illumination angle θ. The brightness enhancement film can be based on micro-prisms or multilayer reflective polarizers, for example. The brightness enhancement film can be disposed between the collimating filter 1520 and the light source 1510.

Figure 16:
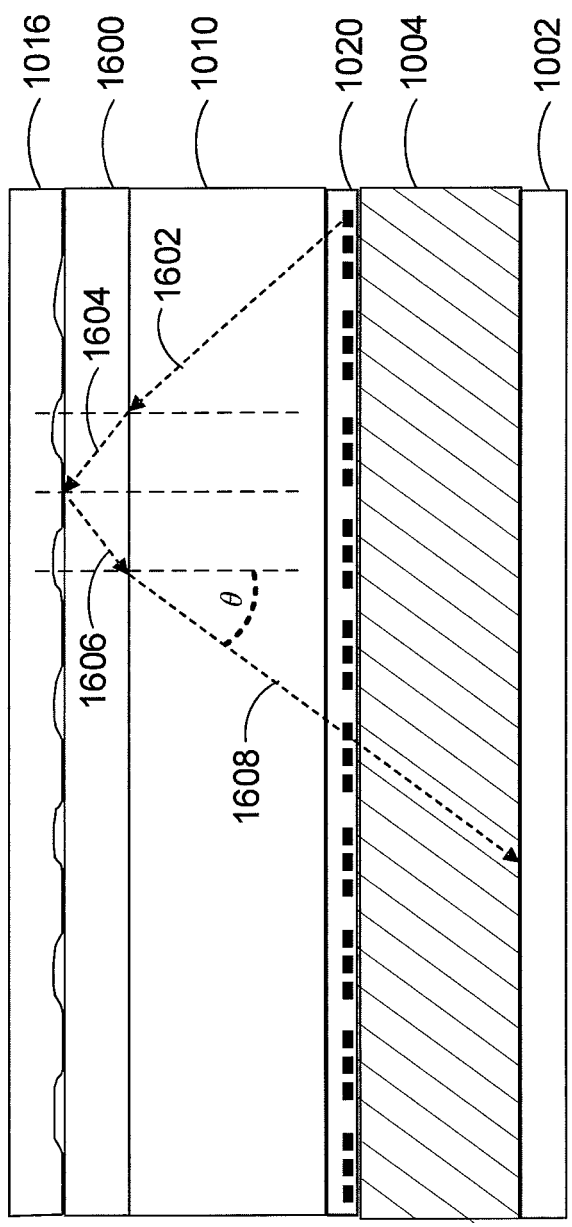
FIG. 16 depicts an embodiment in which a screen protection film is included over a cover layer.

In some implementations, a protection layer such as a protective film or a screen protector may be placed on top of the cover layer of an electronic device. FIG. 16 depicts an embodiment in which a protective layer 1600, e.g., screen protection film 1600, is included over a cover layer 1010, providing a protective barrier from scratching or breaking to cover layer 1010. In the example of FIG. 16, an image sensor array 1002 is disposed below a display layer 1020 (e.g., below a transparent OLED display substrate and below light emitters of the OLED display). The display layer 1020 is disposed below the cover layer 1010. A protection film 1600 is placed on top of the cover layer 1010, where a top surface of the protection film 1600 provides an input surface for an input object 1016, e.g., a finger. Light source(s) for illuminating the input surface are disposed in the display layer 1020 (e.g., light emitters disposed above a transparent display substrate, or OLED light emitting display pixels themselves, are used to illuminate the finger 1016). An angled collimator layer 1004 is disposed below the light source(s) and the display layer 1020. The image sensor array 1002 is disposed below the angled collimator layer 1004.

As shown, light 1602 from the light source(s) travels through the cover layer 1010 towards finger 1016 and is refracted by the protection film 1600 as refracted light 1604. The refracted light 1604 reflects from the sensing surface as reflected light 1606. The reflected light 1606 is refracted again by the protection film 1600 and exits the protection film 1600 as light 1608. Light 1608 travels through the cover layer 1010 at an angle (θ) such that it passes through the angled collimator layer 1004. In some embodiments, a refractive index ($n_{film}$) of the protection film 1600 may be different than the refractive index ($n_{glass}$) of the cover layer 1010. In some embodiments, the refractive index ($n_{film}$) of the protection film 1600 is the same as the refractive index ($n_{glass}$) of the cover layer 1010.

Based on the Fresnel equations, the valley reflectance $R_{Valley}$ and ridge reflectance $R_{Ridge}$ from the finger 1016 in FIG. 16 are dependent on the refractive index ($n_{glass}$) of the cover layer 1010, the refractive index ($n_{film}$) of the protection film 1600, the refractive index ($n_{skin}$) of the finger 1016, and the refractive index (noir) of the air gaps of valleys of the finger 1016.

Figure 17:
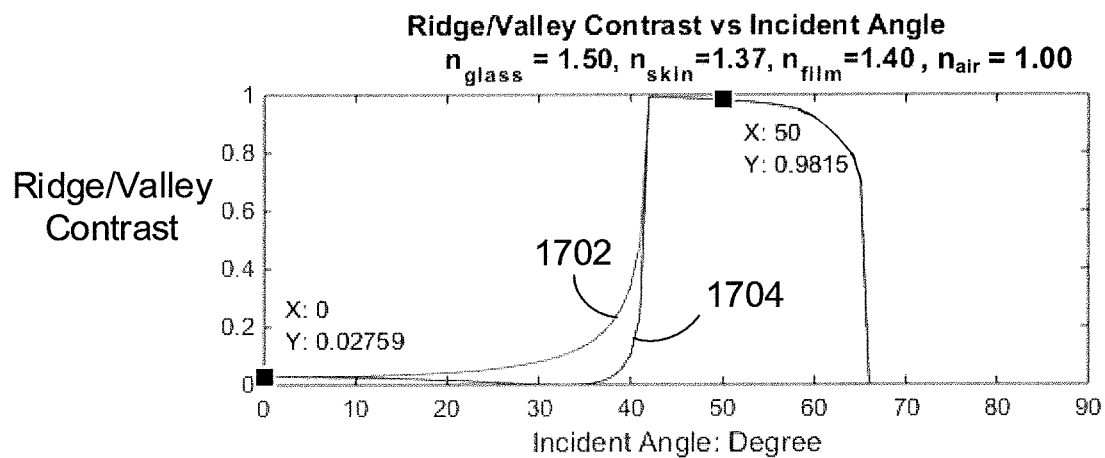
FIGS. 17-18 are graphs illustrating example ridge/valley contrast of a sensor device that includes a protection film, according to some embodiments.

FIG. 17 is a graph illustrating example ridge/valley contrast of a sensor device that includes a protection film, according to one embodiment. In the example in FIG. 17, the refractive index of glass ($n_{glass}$) is 1.50, refractive index of finger skin ($n_{skin}$) of the ridge is 1.37, refractive index of the air gap ($n_{air}$) of the valley is 1.00, and the refractive index of the protection film ($n_{film}$) is 1.40. Curve 1702 represents ridge/valley contrast for s-polarized light. Curve 1704 represents ridge ridge/valley contrast for p-polarized light. As shown in the graph, at an incident angle of 0 degrees, the ridge/valley contrast is just 2.759%. By contrast, at an incident angle of 50 degrees, the ridge/valley contrast is 98.15%. As such, the signal that differentiates between ridge and valley can be improved by ~35 times (35×) with an optimized incident angle. In the example shown in FIG. 17, such an optimized angle is approximately 42 degrees to approximately 65 degrees.

Figure 18:
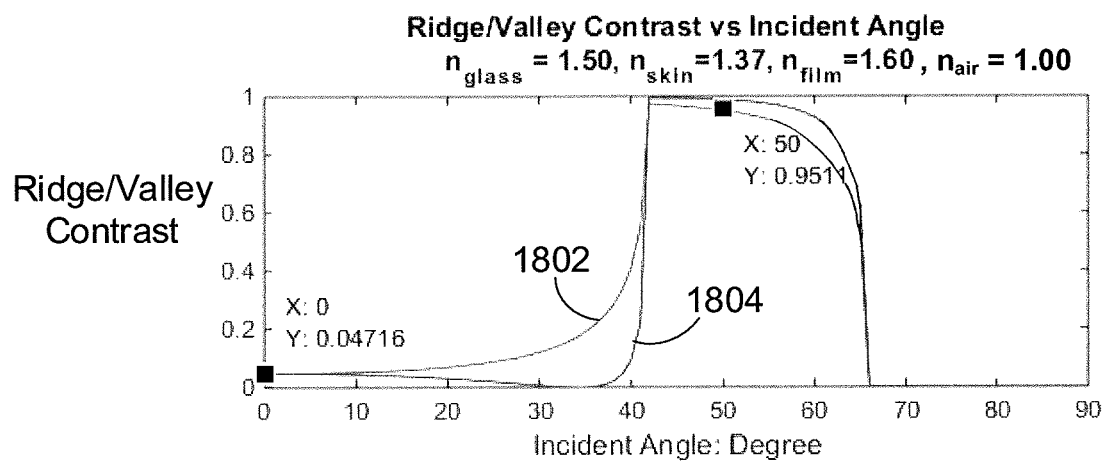

FIG. 18 is a graph illustrating example ridge/valley contrast of a sensor device that includes a protection film, according to one embodiment. In the example in FIG. 18, the refractive index of glass ($n_{glass}$) is 1.50, refractive index of finger skin ($n_{skin}$) of the ridge is 1.37, refractive index of the air gap ($n_{air}$) of the valley is 1.00, and the refractive index of the protection film ($n_{film}$) is 1.60. Curve 1802 represents ridge/valley contrast for s-polarized light. Curve 1804 represents ridge ridge/valley contrast for p-polarized light. As shown in the graph, at an incident angle of 0 degrees, the ridge/valley contrast is just 4.716%. By contrast, at an incident angle of 50 degrees, the ridge/valley contrast is 95.11%. In the example shown in FIG. 18, such an optimized angle to improve ridge/valley contrast is approximately 42 degrees to approximately 65 degrees.

As can be seen by comparing the graphs in FIGS. 17-18 (i.e., including protection film) with the graphs in FIG. 7 (i.e., not including protection film), the ridge/valley contrast loss caused by internal reflection of protection film is just a few percent; thus, good performance may still be achieved even when using protection film. When using protection film, the waveforms are very similar to not using protection film, which means the same optimized acceptance angle can work for both cases (i.e., with or without protection film).

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A device for optical sensing, comprising:
    a display comprising a transparent substrate and a plurality of light emitters disposed above the transparent substrate;
    a transparent cover layer disposed above the display, wherein a top surface of the transparent cover layer provides an input surface for sensing an input object;
    an angled filter disposed below the transparent substrate of the display, wherein the angled filter is configured to allow light within a tolerance angle of an acceptance angle to pass through the angled filter, wherein the acceptance angle is centered around a non-zero angle relative to a normal of the input surface; and
    a plurality of microlenses disposed at a top surface of the angled filter and configured to focus light through the angled filter towards an image sensor disposed below the angled filter,
    wherein the non-zero angle is between a first angle corresponding to total internal reflection at an interface between the input surface and a first substance and a second angle corresponding to total internal reflection at an interface between the input surface and a second substance.

2. The device of claim 1, wherein the input object comprises a finger, and the first substance comprises air and the second substance comprises a fingerprint ridge of the finger.

3. The device of claim 1, wherein the angled filter further comprises a fiber oriented at the non-zero angle.

4. The device of claim 1, wherein the angled filter further comprises a plurality of transparent layers and a plurality of light shielding layers, wherein each of the light shielding layers includes apertures configured to allow light at the non-zero angle to pass through the angled filter.

5. The device of claim 4, wherein a first light shielding layer of the plurality of light shielding layers comprises apertures having a first diameter, and wherein a second light shielding layer of the plurality of light shielding layers comprises apertures having a different second diameter.

6. The device of claim 4, wherein a first transparent layer of the plurality of plurality of transparent layers has a first thickness, and wherein a second transparent layer of the plurality of plurality of transparent layers has a different second thickness.

7. The device of claim 1, wherein the input object comprises a finger,
    and the image sensor is configured to capture a fingerprint image of the finger based on illumination of the input surface by the plurality of light emitters in the display.

8. The device of claim 1, wherein the display comprises an organic light emitting diode (OLED) display.

9. An optical sensor, comprising:
    an image sensor array comprising a plurality of pixels; and
    an angled filter disposed above the image sensor array, the angled filter comprising a plurality of light collimating apertures and light blocking material, wherein the angled filter is configured to allow light reflected from an input surface towards the image sensor array that is within a tolerance angle of an acceptance angle to pass through the angled filter, wherein the acceptance angle is centered around a non-zero angle relative to a normal of the input surface, wherein the non-zero angle is between a first angle corresponding to total internal reflection at an interface between the input surface and a first substance and a second angle corresponding to total internal reflection at an interface between the input surface and a second substance, wherein the angled filter further comprises a plurality of transparent layers and a plurality of light shielding layers, each of the light shielding layers comprising apertures configured to allow light at the non-zero angle to pass through the angled filter, wherein a first light shielding layer of the plurality of light shielding layers comprises apertures having a first diameter, and wherein a second lower light shielding layer of the plurality of light shielding layers comprises apertures having a smaller second diameter.

10. The optical sensor of claim 9, wherein the first substance comprises air and the second substance comprises a fingerprint ridge of a finger.

11. The optical sensor of claim 9, wherein the angled filter further comprises a fiber oriented at the non-zero angle.

12. The optical sensor of claim 9, wherein a first transparent layer of the plurality of transparent layers has a first thickness, and wherein a second transparent layer of the plurality of transparent layers has a different second thickness.

13. The optical sensor of claim 9, wherein the image sensor array is configured to capture a fingerprint image of a finger based on illumination of the input surface by one or more light sources.

14. The optical sensor of claim 13, further comprising a plurality of microlenses disposed at a top surface of the angled filter and configured to focus light through the angled filter towards the image sensor array.

15. An electronic device, comprising:
the device for optical sensing of claim 1; and
a processing system in operative communication with the device of optical sensing.

16. The electronic device of claim 15, wherein the processing system comprises a processor and a memory.

17. An electronic device, comprising:
the optical sensor of claim 9; and
a processing system in operative communication with the optical sensor.

18. The device of claim 1, wherein the angled filter further comprises a plurality of transparent layers and a plurality of light shielding layers, each of the light shielding layers comprising apertures configured to allow light at the non-zero angle to pass through the angled filter, wherein a first light shielding layer of the plurality of light shielding layers comprises apertures having a first diameter, and wherein a second lower light shielding layer of the plurality of light shielding layers comprises apertures having a smaller second diameter.

19. The optical sensor of claim 9, wherein a first transparent layer of the plurality of transparent layers has a first thickness, and wherein a second lower transparent layer of the plurality of transparent layers has a greater second thickness.

* * * * *